United States Patent [19]
Leising et al.

[11] Patent Number: 6,117,529
[45] Date of Patent: Sep. 12, 2000

[54] ORGANIC ELECTROLUMINESCENCE DEVICES AND DISPLAYS

[75] Inventors: Günther Leising, Graz; Stefan Hampel, Obdach; Farideh Meghdadi, Graz; Berthold Winkler, Graz; Christoph Brandstätter, Graz, all of Austria; Ullrich Scherf, Mainz-Kastel, Germany; Stefan Tasch, Jennersdorf, Austria

[73] Assignee: Günther Leising, Graz, Austria

[21] Appl. No.: 08/768,497

[22] Filed: Dec. 18, 1996

[51] Int. Cl.⁷ ...................................................... H05B 33/22
[52] U.S. Cl. ........................... 428/209; 428/201; 428/212; 428/457; 428/690; 428/702; 428/917; 313/112; 313/504; 313/505; 313/506; 257/88; 257/89; 257/98
[58] Field of Search ................................... 257/88, 89, 98; 313/111, 112, 113, 504, 505, 506; 428/201, 203, 207, 209, 212, 457, 690, 701, 702, 917

[56] References Cited

U.S. PATENT DOCUMENTS

| | | | |
|---|---|---|---|
| 5,405,710 | 4/1995 | Dodabalapur et al. | 428/690 |
| 5,521,759 | 5/1996 | Dobrowolski et al. | 359/585 |
| 5,554,911 | 9/1996 | Nakayama et al. | 313/504 |
| 5,705,285 | 1/1998 | Shi et al. | 428/690 |
| 5,813,752 | 9/1998 | Singer et al. | 362/293 |
| 5,833,360 | 11/1998 | Knox et al. | 362/293 |
| 5,874,803 | 2/1999 | Garbuzov et al. | 313/506 |

OTHER PUBLICATIONS

Nakayama et al., "Organic photo—and electroluminescent devices with double mirrors", Applied Physics Letters, vol. 63, No. 5, pp. 594–595, Aug. 2, 1993.

*Primary Examiner*—Marie Yamnitzky
*Attorney, Agent, or Firm*—Henry M. Feiereisen

[57] ABSTRACT

An electroluminescence color display screen comprising an organic electroluminescence layer disposed between a patterned base electrode layer and a patterned top electrode layer, and further comprising a color conversion layer and a spectrally selective reflector for improving the color efficiency of the color display screen.

15 Claims, 11 Drawing Sheets

SECTION A-A

SECTION B-B

Chemical structure of (a) oligophenylene n=5-20, (b) substituted oligophenylene n=5-20 ($X_1$, $X_2$, $Y$ :-H, -F, -alkyl, -Cl, -N, -CF, -CN), (c) chain-like poly(paraphenylene) LPPP ($R_1$, $R_2$, $R_3$ :-alkyl)

FIG. 8

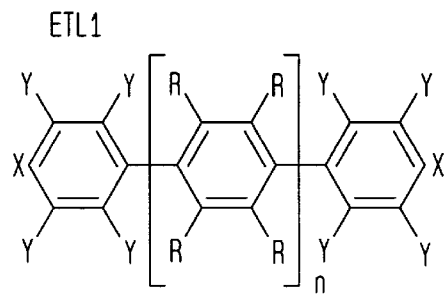

FIG. 9

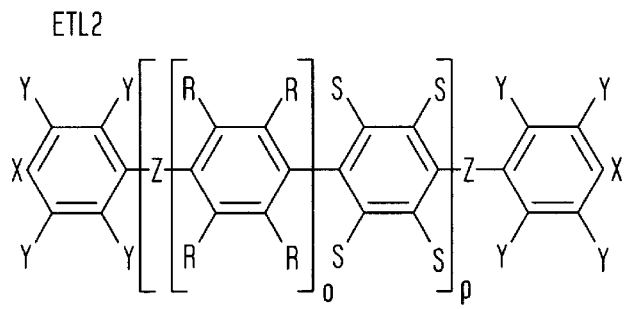

Chemical structure of materials which may be used as electron transport layers. ETL1 (X, X' = -CCF$_3$, -CH, -N; CNH$_2$; -CCN; -CF; -CBr; and Y, R = H, F; n=0, 1,..., 6;) and ETL2 (X, X' = -CCF$_3$; -CH; -N; CNH$_2$; -CCN; -CF; -CBr; and Y, R, S = H, F; Z = -CH=CH-; -N=CH-; -naphtalene, -perylin, -quarterylin, -porphine, -phtalocyanine; o = 0, 1; p = 0,1,2)

FIG. 10

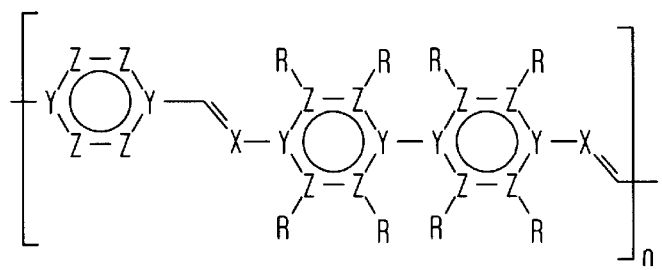

Chemical structure of azomethin-like materials which may be used as hole transport layers (Y, Z=-CCF$_3$; -CH; -N; CNH$_2$; -CCN; -CF; -CBr; R; -H,F; alkyl, -CN; X=-CH; -N; -CF, -CCl)

CONTROL COLUMNS SS

VIEW A

CONTROL COLUMNS SS

SECTION B
EVAPORATION

SECTION B
SPINCOATING

CONTROL COLUMNS SS

VIEW A

SECTION B-B

VIEW A

MODIFICATION

CONTROL COLUMNS SS

VIEW A

SECTION A-A

SECTION B-B

SECTION A-A

SECTION B-B

SECTION A-A

SECTION B-B

ORGANIC ELECTROLUMINESCENCE DEVICES AND DISPLAYS

BACKGROUND OF THE INVENTION

The invention relates to an electroluminescence device comprising a multilayer system including an active electroluminescence layer made of an organic semiconductor and capable of emitting light under the influence of an electric field, the electroluminescence layer disposed between a cathode layer for injecting electrons into the electroluminescence layer and an anode layer for injecting holes into the active layer, wherein, if necessary, a hole injection layer is disposed between the anode layer and the electroluminescence layer and/or an electron injection layer is disposed between the cathode layer and the electroluminescence layer.

Known devices of this type emit light in a spectral region mostly representing the region of the visible spectrum with the higher energy characterized mainly by the visible color blue and the invisible ultraviolet. Light in this spectral region has the major advantage that it can be converted by simple means into all the other colors in the visible spectrum. For example, a fluorescent dye may be excited which in turn emits light in a spectral region having a lower energy—i.e., at a longer wavelength—by way of photoluminescence.

The light in the active electroluminescence layer is generated by organic semiconductors, whereby the electrons and holes are injected into this organic semiconductor from opposing electrodes if an external voltage, usually between 5 and 20 Volts, is applied. Electroluminescence occurs when the electric carriers of opposite charge combine to form exciton states (singlet excitons) which subsequently decay radiatively. Organic electroluminescence devices can be designed to have a thickness in the order of microns, to be flexible and to cover large areas, while emitting colors from the near-infrared to the ultraviolet portion of the spectrum. The application of organic semiconductors for flat panel displays is very promising due to their high luminance (>10,000 $cd/m^2$), their high efficiency and their low operating voltages. Thin film organic electroluminescence devices have found applications in multi-color flat panel displays because they are simple to manufacture, have a high brightness and provide a large number of different emission colors.

The first scientific publication in the field of polymer semiconductor diodes was published by J. H. Burroughs in Nature 347 (1990) and relates to the use of polyphenylenevinylene (PPV) as an active electroluminescence layer.

The emission of visible light from organic semiconductors is also known from an article in Appl. Phys. Lett. 51, (1987) describing the use of electroluminescence from conjugated polymers, such as MEH-PPV, for making a light-emitting diode (LED) having a MEH-PPV layer placed on a glass substrate coated with indium-tin-oxide (ITO) and a rectifying metal contact disposed on top of the MEH-PPV layer. In this article, the preferred explanation of light emission is based on a tunneling model whereby the electrons tunnel directly from the rectifying metal contact into an upper polaron level.

In the article Adv. Mat. 4 (1992), 36–37, the problem associated with the generation of blue light by a LED is discussed and a blue-emitting PPP-LED is proposed which includes the customary ITO glass substrate and the aluminum electrodes.

The application of double-stranded poly-(paraphenylene) LPPP with partially protonized side groups in electroluminescence devices was first reported by G. Grem and G. Leising in Synthetic Metals 1993.

From DE-A1-38 04 293 there is known an arrangement with an electroluminescence diode wherein the light-emitting surface of the diode is covered with an element made of plastic, the element comprising an additive of titaniumoxide and at least one fluorescent, color converting organic dye, such as polymethylmethacrylate.

In JP-A-4 276 171 (Abstracts of Japan Vol. 18, No. 419) there is further disclosed an organic electroluminescence element having a strong emission as a result of the use of a transparent substrate, of transparent electrodes and of a color filter made of BPF. The use of a filter provides a substantial narrowing of the emission spectrum.

In U.S. Pat. No. 5,408,109 there are described LED's made of soluble semiconducting polymers, such as MEH-PPV, which do not require thermal treatment for their polymerization.

Furthermore, in U.S. Pat. No. 4,885,211 there are also discussed various organic luminescent materials, with an emphasis on a particularly preferred LED design wherein a hole transport layer and an electron transport layer is disposed between two electrodes, the one electrode having a high work function and the other electrode having a low work function. The cathode has a layer made of several metals with at least one of these layers having a high work function.

The electroluminescence cell discussed in U.S. Pat. No. 4,539,507 also includes a hole injection layer and an electron transport layer, with the first layer proximate to a transparent metallic anode for injecting the holes.

Color picture elements (pixels) of which a flat panel display screen is composed, can be implemented by arranging next to each other blue, green and red organic light-emitting diodes (OLED), or by using LED's emitting at optical wavelengths which can be selected based on the applied voltage, the electric current, the operating temperature or other parameters.

The abstracts of the "IS&T 49th Annual Conference" describe an organic electroluminescence device combining a blue organic electroluminescence display with color converting materials. The color converting materials basically consist of an organic fluorescent dye capable of changing the emitted color from blue to green or red. The blue organic multi-layer electroluminescence device consists of an ITO anode, a hole injection layer, a hole transport layer, an emission layer (DPVBI), an electron transport layer, and a cathode of magnesium and aluminum. For the generation of multiple colors, red, green and blue subpixels are arranged on a glass substrate in a pattern, wherein the red and green color, respectively, is generated by a corresponding red or green dye layer disposed on top of the blue emission layer. Disposed thereupon is a protection layer, followed by the anode and all the remaining layers, including the blue emission layer and the cathode. This arrangement has the disadvantage that the red color has only a very low intensity due to the low spectral content of this color in the blue color emitted by the active layer.

U.S. Pat. No. 5,126,214 describes an electroluminescence device where the blue light is converted into red and green light through fluorescent dye layers. Red light is generated from the blue fundamental emission by superimposing two different dye layers. Electron transport layers as well as hole transport layers are provided for improving the efficiency of light generation.

In addition, U.S. Pat. No. 5,294,870 describes an electroluminescence device emitting in the blue with the pixel matrix of the display screen being patterned. The fundamental emission in the blue is converted through fluorescent dye layers into the other primary colors green and red, wherein each color pixel is subdivided into at least two subpixels.

The electroluminescence devices described above have the disadvantage that the optical efficiency is much too small for many applications.

A further disadvantage is that the emission spectrum of the known devices lies in an disadvantageous wavelength regime resulting in a rather weak intensity for color conversion.

SUMMARY OF THE INVENTION

It is the object of the invention to provide an electroluminescence device of the aforedescribed type capable of achieving the highest possible efficiency.

It is a further object of the invention to provide an electroluminescence device with a high emission efficiency that provides excellent color conversion properties.

The object of the invention is achieved by a electroluminescence layer comprising double-stranded poly-(paraphenylene) (LPPP) with alkylated side chains in form of a compound represented by the formula

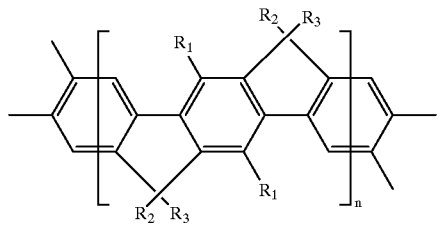

wherein n=1, . . . ; $R_1$, $R_2$, $R_3$: -alkyl.

The LPPP of the invention with alkylated side chains is fundamentally different from the known LPPP employed in electroluminescence devices with respect to its stability and the emission color, which for the LPPP of the invention lies in the blue spectral range.

The alkylated side chains of the invention provide a much better environmental stability than the conventional LPPP, better crystallization properties and the blue emission color with its aforementioned advantages.

The object of the invention is also achieved in the device described before in that the electroluminescence layer comprises long-chain oligophenylene in form of a compound represented by the formula

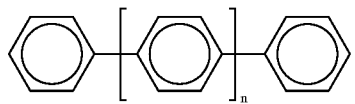

wherein n=5–20.

Oligophenylenes have been successfully employed before as light-emitting layers in electroluminescence devices (W. Graupner et al., Mol. Cryt. Liq. Cryst. 256 (1994) 549); however, their length was at most equal to the length of the hexaphenylenes, with most of their light emission in the UV region which is not only invisible to the human eye, but also hazardous. Longer compounds which are the subject matter of this invention, could not be synthesized to this date.

The long-chain oligophenylenes of the invention are characterized by light emission in the blue spectral range, making them particularly suitable for applications in display screens and other illuminated displays. Additional very bright colors can be achieved as a result of the excellent color conversion efficiency.

In another embodiment of the invention, the oligophenylene may be a fluoridated oligophenylene represented by the formula

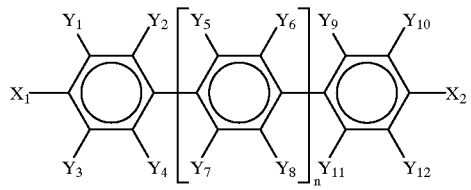

wherein n=5–20 ($X_1$, $X_2$, $Y_{1 \ldots 12}$:—H, —F, -alkyl, —Cl, —N, —$CF_3$, —CN).

The fluorinated oligophenylenes of the invention represent a completely new class of materials distinguished by an especially high electron mobility.

A further disadvantage of known electroluminescence devices is that the electron transport form the cathode into the active layer is very lossy due to undesirable side effects and that the cathode consequently has poor stability and life time.

It is therefore an object of the invention to provide an electroluminescence device of the type described before which can provide a most efficient transport of the electrons injected by the electrodes into the active layer.

This object is achieved by the invention in that the electron injection layer comprises a compound represented by the formula

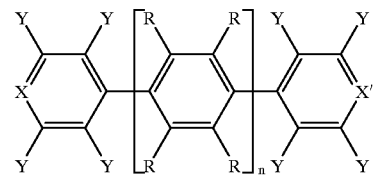

wherein X, X'=—$CCF_3$; —CH; —N; $CNH_2$; —CCN; —CF; —CBr; and Y, R=H, F; n=0, 1, . . . , 6; and/or a compound represented by the formula

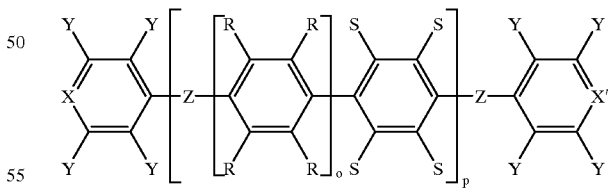

wherein X, X'=—$CCF_3$; —CH; —N; $CNH_2$; —CCN; —CF; —CBr; and Y, R, S=H, F; Z=—CH=CH—, —N=CH—; -naphthalene, -perylin, -quarterylin, -porphine, -phthalocyanine; o=0, 1; p=0, 1, 2.

The layer of the invention exhibits a very high electron mobility, thereby significantly improving the stability of an electroluminescence device constructed with said layer over the known devices of this type since the degradation processes near the cathode caused by local temperature effects or electromigration processes are reduced significantly.

In another embodiment of the invention, the hole injection layer may comprises poly- or oligoazomethine-like compounds represented by the formula

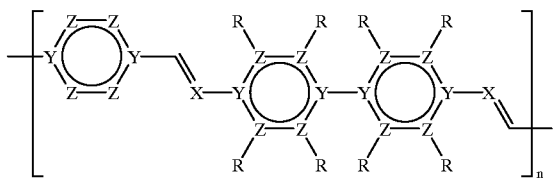

wherein X, Z=—CCF$_3$; —CH; —N; CNH$_2$; —CCN; —CF; —CBr; R; —H, F; alkyl, —CN; X=—CH; —N; —CF, —Ccl.

A layer formed in this way can improve the hole injection from the anode into the active layer, since various annihilation effects causing annihilation of the holes before they encounter electrons, are eliminated.

According to another feature of the invention, a layer consisting of silanized compounds, for example ClSi, may be disposed between one of the anode or cathode layers and the electroluminescence layer and/or the respective electron or hole transport layer, as the case may be.

A layer of this kind can improve the adhesion properties of the first monomer layer.

In addition, the invention relates to an electroluminescence color display screen having matrix picture elements (pixels) and comprising a multi-layer system comprising a plurality of single layers disposed on top of and partially next to one another, the multi-layer system comprising an insulating, optically at least translucent base layer, a conductive, optically at least translucent base electrode layer arranged in a stripe pattern, an organic electroluminescence device, a top electrode layer arranged in a stripe pattern, and, if necessary, one or several color conversion layers and one or several passivating layers.

Color display screens of this type known in the art were only capable of achieving a poor contrast when compared with conventional display screens, accompanied by a disappointing pixel sharpness.

It is therefore an object of the present invention to provide a color display screen capable of providing a better picture contrast and an improved definition of the color picture.

This object is achieved by arranging—viewed in the direction of the emitted light—one or several spectrally selective mirror/transmitter layers subsequent to the base layer or to the color conversion layer(s) for spectrally filtering and improving the efficiency of the emission spectrum.

As a result, the spectral portion of the light having a high energy is reflected back by the mirror/transmitter layer(s) until color conversion in the color conversion layers has proceeded to a point where the efficiency is enhanced significantly. Consequently, the other primary colors converted from the one primary color are obtainable with a higher luminance, thereby providing a significantly improved image contrast.

In a modification of the invention, the spectrally selective mirror/transmitter layers may consist of layers with alternating high and low optical index of refraction, wherein the layer with a high optical index of refraction is made of TiO$_2$ and the layer with a low optical index of refraction is made of MgF$_2$.

This arrangement forms a dielectric bandpass allowing only light within a narrow spectral range to pass, with all other wavelength being reflected back.

In another embodiment of the invention, a highly transparent protection layer may be provided—viewed in the direction of light emission—subsequent to the base layer and/or the color conversion layers.

This allows optical matching with the index of refraction of adjacent layers and smoothing the height differences between layers of different thickness.

Furthermore, there may be provided one or more isolation layers between said layers for thermally separating the color conversion layers and preventing thermal cross-talk therebetween.

In a further embodiment of the invention, the base layer may be composed of individual light guides arranged in the direction of the emitted light.

When the base layer is constructed in this fashion, similar to a optical multi-channel plate, the emitted radiation is observed to be emitted with an especially distinct directionality.

In another modification of the invention, the stripe-like base electrode layer and the top electrode layer may each have one discontinuity.

In addition, the fluorescent dye molecules of the color conversion layers may be disposed in the color conversion layers in form of a matrix and isolated from each other, with the matrix made of, e.g. PMMA, polystyrene.

The dyes are thereby distributed homogeneously, providing very efficient color conversion.

In another modification, the color conversion layers made of fluorescent dyes may be chemically bonded to a backbone molecule as side chains.

In this way, the dyes in the color conversion layers can be prevented from forming aggregates, without necessitating thick color conversion layers.

In a further embodiment of the invention, the dye molecules in the color conversion layer(s) may have a specific orientation.

Hereby, the emission of the converted light from the color conversion layer may be more directional.

According to another modification of the invention, the top electrode layer may be fabricated from two or more materials.

In this way, the top electrode layer may be better adapted to the various requirements of the color display screen of the invention. For example, a material with a high conductivity may be combined with a hard material in order to prevent the top electrode layer from being destroyed during contact formation.

In another embodiment of the invention, there may be provided an optically polarizing color conversion layer.

With this arrangement, white light of high spectral purity can be generated through combination with polarized green and red light emitted from other color conversion layers.

It is another object of the invention to provide a method for making a color display screen according to the invention which is capable of improving the separation between the individual color pixel areas.

This object of the invention is achieved by a method wherein the base electrode layer is applied in form of parallel stripes onto the base layer, wherein an electrically insulating material is subsequently applied on top in form of parallel stripes which run perpendicular to the parallel stripes of the base electrode layer, wherein subsequently the active electroluminescence material is applied in form of parallel stripes over and offset in height from the parallel stripes of the base electrode layer, wherein the top electrode layer is subsequently applied in form of parallel stripes perpendicular to the stripes of the electroluminescence layer and—offset in height—on top of the gaps of the parallel stripes of the electrically insulating material.

In this way, the individual pixels are well separated and the sharpness is improved as a result. In addition, short circuits between the individual electrodes are also effectively eliminated.

In another embodiment of the invention, a light-sensitive electron injection layer may be applied on top of the active electroluminescence layer as a continuous layer and then exposed in parallel stripes, thereby becoming insulating in these areas, whereafter the top electrode layer is patterned in form of stripes.

In this way, the electron injection layer can advantageously be utilized jointly for forming the display screen.

It is a further object of the invention to provide a method for fabrication a color display screen of the invention, wherein both the electron and the hole injection layer can be fabricated in a simple fashion.

This is accomplished by the invention in that the base electrode layer, the hole injection layer and the active electroluminescence layer are applied onto the base layer in form of superimposed parallel stripes, that the electron injection layer and the top electrode layer are thereafter first evaporated as continuous layers and afterwards patterned in form of parallel stripes perpendicular to the stripes of the base electrode, whereby the active electroluminescence layer is patterned at the same time.

It is another object of the invention to provide a device for generating polarized white light by way of converting light from an electroluminescence device, in particular from an electroluminescence device made of organic materials and having the primary color blue.

This is accomplished by the invention in that—viewed in the direction of the emitted light—there are arranged oriented color conversion layers comprising dyes with a preferential optical orientation and preferably orientatable in a liquid crystal matrix.

The light emitted from the color conversion layers is polarized, regardless if the light from the electroluminescence device is polarized or not. For unpolarized blue light emitted from the electroluminescence device, the dyes are constructed such that they absorb in the blue spectral region only perpendicular to the molecular axis, but emit the color-converted light by way of intramolecular energy transfer parallel to the preferred orientation of the molecular axis. As a result, the color-converted blue light is superimposed with the transmitted blue light along the direction of the molecular axis, whereby white light is generated through combination of several converted colors with the blue color.

In another embodiment of the invention, there may be arranged—viewed in the direction of the emitted light—one or more spectrally selective mirror/transmitter layers.

Hereby, the spectral purity of the emitted light is improved significantly, resulting in a significantly higher color conversion efficiency.

Furthermore, according to another embodiment of the invention, the blue light emitted from the electroluminescence device may also be polarized.

This is accomplished by coating the blue light emitting device of the invention with one or more color conversion layer(s) having its (their) thickness selected such that a portion of the blue exciting radiation is able to pass through the color conversion layer(s) without undergoing color conversion, thereby generating white polarized light in combination with the converted portions of the light.

BRIEF DESCRIPTION OF THE DRAWING

The invention will be discussed hereinafter with reference to the embodiments illustrated in the drawing. In the drawing is shown in FIG. 1 a layout of an embodiment of an color display screen according to the invention;

FIGS. 8, 9 chemical structures of the electron injection layer of an electroluminescence device according to the invention;

FIG. 10 a chemical structures of the hole injection layer of another electroluminescence device according to the invention;

DETAILED DESCRIPTION OF PREFERRED EMBODIMENTS

Figure 4:
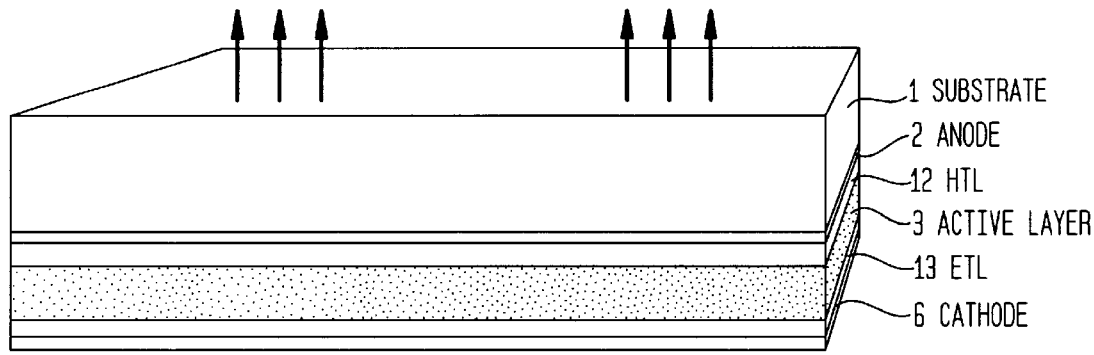
FIG. 4 an oblique cross-section of an electroluminescence device according to the invention.

In FIG. 4 is shown an electroluminescence device comprising a multi-layer system which includes an active electroluminescence layer 3 made of an organic semiconductor and emitting light when an electric field is applied, the electroluminescence layer 3 disposed between a cathode layer 6 for injecting electrons into the electroluminescence layer 3 and an anode layer 2 for injecting holes into the active layer.

For increasing the light efficiency, a hole injection layer 12 is arranged between the anode layer 2 and the electroluminescence layer 3, and an electron injection layer 13 is arranged between the cathode layer 6 and the electroluminescence layer 3.

Figure 7:
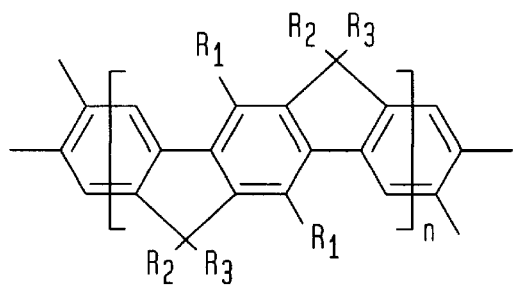

According to the invention, the electroluminescence layer 3 comprises a chainlike poly(paraphenylene) (LPPP) with alkylated side chains in form of a compound represented by the-formula shown in FIG. 7, wherein $R_1$, $R_2$, $R_3$: -alkyl.

These alkylated side chains provide the LPPP with a very intense emission in the blue spectral range.

Figure 5:
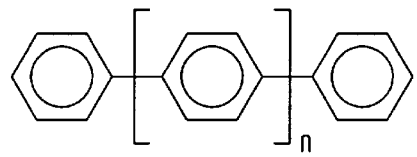
FIGS. 5, 6 and 7 chemical structures of the electroluminescence layer of an electroluminescence device according to the invention.

Another structure of the electroluminescence layer 3 is shown in FIG. 5 which is formed of long-chain oligophenylene (n=5–20). This, in contrast to the known oligophenylenes, results in radiation visible to the human eye extending mainly across the blue spectral region.

Figure 6:
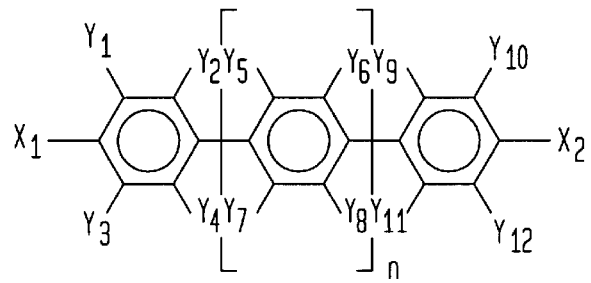

In another modification of the invention, the electroluminescence layer 3 may comprise fluorinated oligophenylene or a similar chemical compound as represented by the chemical formula of FIG. 6 having substituted oligophenylenes ($X_1$, $X_2$, $Y_{1\ldots 12}$:—H, —F, -alkyl, —Cl, —N, —$CF_3$, —CN). This material which could not be fabricated until now, enables the generation of intense blue light.

Figure 1:
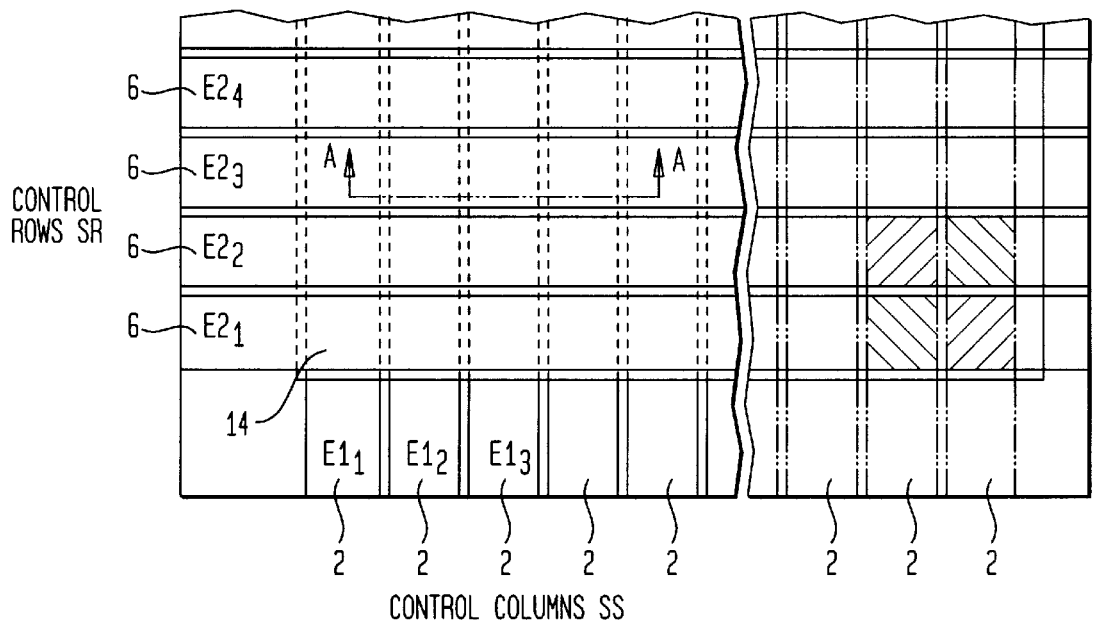
Figure 2:
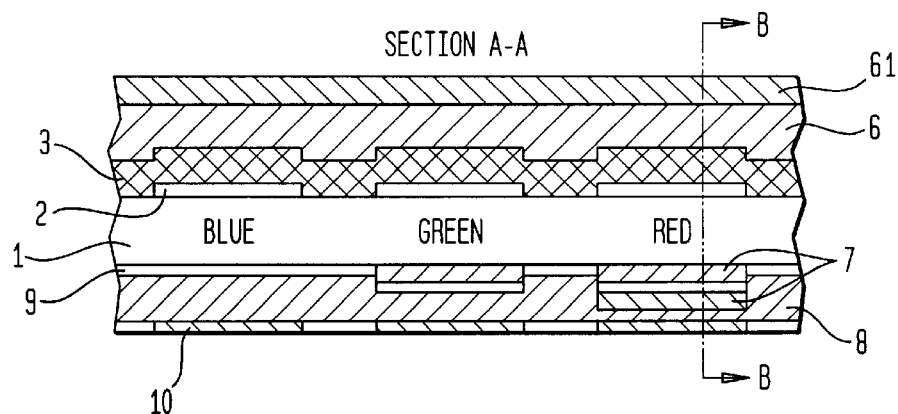
FIG. 2 a partial cross-section A—A through a color display screen according to FIG. 1.
Figure 3:
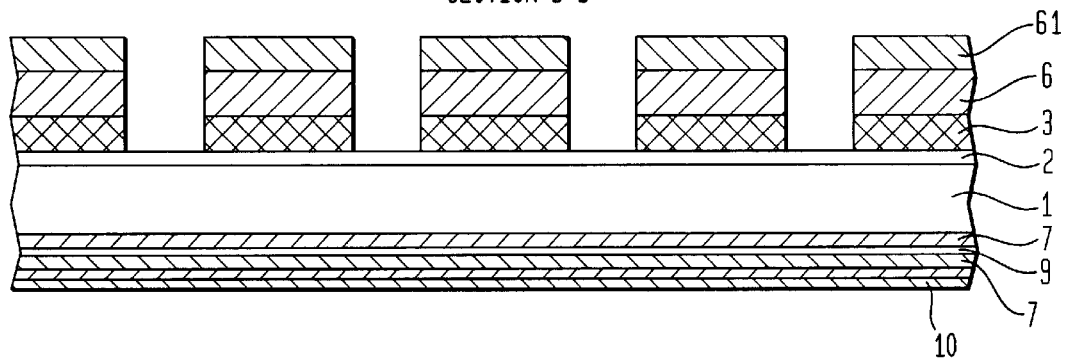
FIG. 3 a partial cross-section B—B through a color display screen according to FIG. 1.

In the FIGS. 1 to 3, there is shown an electroluminescence color display screen having matrix pixels and comprising a multi-layer system comprising single layers disposed on top of and partially next to one another, the multi-layer system further comprising an insulating, optically at least translucent base layer with several layers disposed on both of its surfaces. On one side of the base layer 1 there is disposed a conductive, optically transparent, but at least translucent base electrode layer 2 arranged in a stripe pattern, followed by an organic electroluminescence layer 3 having parallel stripes perpendicular to the base electrode stripes 2, and a top electrode layer 6 also having a stripe pattern perpendicular to the base electrode stripes 2, while on the opposing side of the base layer 1 there are disposed several color conversion layers 7 applied in a matrix pattern. The layers 2, 3 and 6 correspond to the electroluminescence device shown in FIG. 4 which forms a part of the color display screen of the invention. Other devices of this type may, however, be built into the display screen in its place.

According to the invention, it may be provided—viewed in the direction of the emitted light—one or more spectrally selective mirror/transmitter layers 10 either following the base layer 1 or the color conversion layer(s) 7 for spectral filtering and for increasing the efficiency of the emission spectrum.

According to FIG. 2, the optically transparent electrode layer 2 is applied in form of equidistant parallel stripes onto the optically transparent, but at least translucent base layer 1 which forms the basis for the color display screen of the invention. Onto the stripe-like electrode layer 2, the organic electroluminescence layer 3 is also applied in form of stripes which are oriented perpendicular to the parallel stripes of the electrode layer 2. In the next step, the cover electrode 6 is applied in form of parallel stripes and is also oriented perpendicular to the electrode layer stripes 2. The result is a layer structure according to the structure shown in FIG. 3 in the direction of the base electrodes and in FIG. 2 in the direction of the cover electrodes 6.

On the side of the base layer 1 opposite from the electrodes 2, 6 there are patterned fluorescent materials in the color conversion layers 7 for generating the primary colors, with dielectric spectrally selective mirror/transmitter layers disposed thereupon.

The parallel stripes of the optically transparent electrode layer 2 form the control columns and the parallel stripes of the cover electrode 6 form the control rows of the color display screen of the invention. The projected sections of the two electrodes 2, 6 define pixel areas 14, as shown in FIG. 1. Each pixel area herein represents one of the primary colors red, blue and green. The width of the control columns 2 depends on the required resolution of the display screen and is equal to the width of the control rows 6. The pixel areas formed by the two electrodes 2 and 6 have, in this embodiment, a square shape.

Each control row and column may be individually supplied with a variable voltage for operating the pixel 14 and for controlling their brightness. For example, for activating the pixel area 14, shown in a dot-dashed frame in FIG. 1, the control row 6 and the control column 2 designated with $E2_1$ and $E1_1$, respectively, are connected to a voltage source. The pixel 14 will then appear to the observer in its blue primary color.

A green or red color pixel is obtained by applying the voltage to the electrode $E1_2$ or $E1_3$; when the three control columns $E1_1$, $E1_2$ and $E1_3$ and the control row $E2_1$ are activated simultaneously, the superposition of the three primary colors gives the impression of a white color. Consequently, all required or desired color appearances can be realized at any pixel of the display screen by appropriately addressing the pixels and varying the voltage applied thereto. The grouping of the three primary color pixels implemented in this embodiment should only be viewed as an example and may be realized in another form.

For activating an entire control row 6, e.g. $E2_1$, there exist basically two possibilities, namely to apply a voltage to said control row and to all control columns 2 whereby a still image is generated in the entire control row 6, and, on the other hand, to turn on the pixels 14 sequentially, i.e. pixel after pixel, via the respective control columns 2 with a frequency higher than the response time of the human eye, thereby also providing a still image in a control row 6.

The major disadvantage of the first modification is that the respective control row 6 has to carry the total current of all pixels in the control row, i.e. the sum of the individual currents for all pixels provided by the individual control columns, which would overtax the mechanical and thermal capabilities of the cover electrode layer 6 and of the electroluminescent medium 3. In such arrangement, only a limited number of pixels should be switched at the same time.

For activating an entire control column 2, e.g. $E1_1$, there exist the possibility to apply a voltage to all control rows 6 simultaneously; hereby the disadvantage described above is even more pronounced since the optically transparent control columns 2 have a higher specific resistance. Consequently, only a limited number of pixels should be activated in each control columns 2. For obtaining a fixed image in a control column, a voltage with a correspondingly high frequency is usually sequentially applied to the control rows 6.

As a result of the flexible addressing of the control rows 6 and the control columns 2, the arrangement of the pixels 14 and their association with the primary colors, every desired area color image can be generated with the display screen of the invention.

The color display screen of the invention is based on a blue emitting organic light-emitting diode, the emission color of which is partially converted by color conversion into the primary colors green or red. The generated emission light is subsequently filtered by the dielectric, spectrally selective mirror/transmitter layers 10, so that each primary color can be generated with a very high brightness.

The organic light-emitting diode shown in FIG. 4 basically consists of the organic electroluminescence layer 3 disposed between two different electrodes (anode) 2 and (cathode) 6. By applying a voltage to the electrodes 2 and 6, electrons are injected into the electroluminescence layer 3 from the cathode 6 and holes are injected from the anode 2.

The carriers with opposite charge drift in different directions under the influence of the applied field and are thus able to interact with each other in the active electroluminescence layer 3 to form excited states. The excited states can radiatively decay to the ground state, thereby generating electroluminescence light.

For generating electroluminescence efficiently, the work functions of the two electrodes 2 and 6 have to be well matched to the upper valence band edge and the lower conduction band edge, respectively.

In order to provide the most efficient electron injection from the cathode 6, the cathode material should have a good conductivity and a work function matched to the active medium 3 and therefore as small as possible, e.g. <4–4.5 eV. Since materials with a small work function in particular are usually very reactive, e.g. alkali and alkaline earth metals, a very high environmental stability of the cathode material is also required. Materials suitable as cathode materials include, for example, Al, Ag, Mg, Ca, In and alloys between these materials.

In order to provide the most efficient hole injection from the anode 2, the anode material should have a good conductivity and a work function which should be as large as possible, e.g. >4–4.5 eV. Some materials suitable as anode materials are, for example, Au, Pt and Cu. In addition, degenerate semiconductors obtained by doping, such as indium tin oxide (ITO), doped zinc oxides, indium oxide and other doped semiconductors with a large bandgap as well as doped layers of conjugated polymers, such as doped polyaniline, may be used. The latter materials have the advantage over metal electrodes that they are highly transparent in the visible spectral region. This is important since the light generated in the active medium of the electroluminescence layer 3 is emitted through the base electrode 2 forming the anode, requiring the lowest possible optical losses. For this reason, at least one of the electrodes 2, 6 have to be made transparent or at least semitransparent. Instead of the anode, however, the cathode made be made transparent or at least translucent so that the generated light can leave the device.

In the simplest case, the active medium of the electroluminescence layer 3 consists of an organic light emitting layer. This layer should have good carrier transport properties, a high photoluminescence quantum yield and a small concentration of defects. Blue light emitting diodes are of special interest since blue light can be used to excite dye layers, whereby the blue light can be converted into green and red light.

Organic materials which are chemically similar to the oligophenylene or polyphenylene, have proven to be especially suited for blue LED applications. According to the invention, the electroluminescence layer 3 is formed with the chemical structures shown in FIGS. 5, 6 and 7. The device can be significantly improved, as shown in FIG. 4, by employing additional charge transport layers 12, 13 between the active layer 3 and the electrodes 2 and 6. One reason for this is that the electron an hole transport layers 12, 13 isolate the excited states from the electrodes 2 and 6, thereby reducing the quenching of the luminescence at defect centers mainly located near the electrodes 2 and 6. In addition, the use of special charge transport layers can significantly increase the efficiency and improve the lifetime of the device.

A carrier transport layer disposed between the active layer 3 and the cathode 6 and having a high electron mobility, but only a limited hole mobility, is called an electron injection layer 13. The electron injection into the active electroluminescence layer 3 can be improved significantly by way of an electron injection layer 13 if the LUMO-CB which is the lowest unoccupied molecular state of the electron injection layer 13, lies energetically below the conduction band of the active layer 3, but above the Fermi level of the cathode 6. This means that the electron injection can be controlled by the electron injection layer 13, so that the number of injected electrons can be matched to the number of injected holes, thereby significantly improving the device efficiency. The efficiency of the device can be improved further if the HOMO-VB which is the highest occupied molecular state of the electron injection layer 13, lies energetically below the valence band of the active layer 3. In this case, the electrons and holes are localized at the interface between the electron injection layer and the active layer 3 and are therefore better able to interact, whereby excited states are formed more efficiently.

Preferred materials for use as electron injection layer are the organic molecular compounds of FIGS. 8 and 9. These oligophenylene-like compounds are characterized in that the have good electron transport properties and a low absorption in the visible spectral range.

A carrier transport layer disposed between the active layer 3 and the cathode 6 and having a high hole mobility, but only a limited electron mobility, is with reference to FIG. 4 called a hole injection layer 12. The hole injection into the active layer can be improved significantly if the HOMO-VB of the hole injection layer 12 lies energetically below Fermi level of the anode 2, but above the valence band of the active layer 3. This arrangement lowers the electric field strength during operation and improved the device lifetime. The oligoazomethines (OAM) of FIG. 10 are organic materials which are particularly suited for applications as hole transport layer as a result of their good hole transport properties. These organic compounds can be grown on polar surfaces with a high degree of orientation by a special fabrication technique. The OAM is formed by a step-wise polycondensation of the chemical constituents which are evaporated sequentially. The first monomer layer chemically reacts with the Ol-I groups of the polar surface, whereby the assumes an orientation normal to the surface. The subsequently evaporated compounds then react with the previously formed layers, thereby forming an OAM layer with its individual polymer chains oriented perpendicular to the substrate. The adhesion by the first monomer layer can be improved through the use of compounds comprising various silanized end groups (e.g. ClSi).

Preferred materials for the at least semitransparent anode 2 are—as described above—conducting materials, such as indium tin oxide (ITO), doped polymers or semitransparent thin metal layers with a large work function, such as gold or platinum. Preferred as cathode material for the cathode layer 6, however, is a material with a small work function, e.g. Ca, Mg, Al.

Devices with the layer sequence anode/active layer/cathode in the form of ITO/LPPP/Al emit, depending of the operating voltage, homogeneous blue-green light at $I_{max}=$ 461 nm with a brightness of about 100 cd/m². This configuration which is stable in air, exhibits quantum yields between 0.1% and 1%. The aforedescribed devices can be improved significantly by disposing suitable charge transport layers 12, 13 between the anode and cathode layer 2, 6, respectively, and the active layer 3.

In this way, the emission zone is isolated from the cathode layer where the probability for extinction is very high, and in addition, the balance of charge injection into the active layer can be improved, accompanied by a reduction of the operating voltage.

The hole transport layer 12 disposed between anode layer 2 and active layer 3 is formed by polycondensation reactions of successively deposited monomers, producing highly oriented polyazomethin layers on polar surfaces. The monomers employed herefor are terephtaldehydes and methylated derivatives of phenylendiamines and benzidines.

The hole transport layer 12 is applied as follows. In a first absorption step, terephtaldehyde is deposited onto a substrate at about 105° C. and a substrate temperature of 25° C. Subsequently, the diamine component tetramethylbenzidin is deposited at a source temperature of 140° C., reacting with the terephtaldehyde. The substrate temperature is then increased to 170° C. in order to ensure that no monomer compounds remain in the layer. The first layer is strongly bound to the substrate, thereby enabling additional layers to be formed by depositing aldehyde and diamine components. Oligoazomethin (OAM) is formed by polycondensation.

In ITO/OAM/PHP/Al multi-layer systems, the electric field required for the onset of the current in forward direction is reduced to about 0.3 MV/cm independent of the thickness of the PHP active layer, as compared to the 0.8 MV/cm required for single-layer PHP devices without a OAM hole transport layer. The electric field usually determines the onset of the current and consequently the electroluminescence, since at higher applied voltages, field-induced tunneling of charge carriers from the electrodes into the polymer is the predominant injection mechanism. The reduction of the required field strength for driving the device can thus be attributed to the reduced barrier height for hole injection at the ITO surface, assuming that the current flowing through the device is dominated by holes, meaning positively charged polarons, as is the case for most organic compounds. The increased electroluminescence efficiency which can reach values as high as 2%, and the brightness of up to 360 cd/m$^2$ of ITO/OAM/PHP/Al devices can be attributed to the—compared to single layer devices—reduced quenching effects. Quenching is reduced because the OAM layer prevents the non-radiative recombination of electrons, meaning negatively charged polarons, at the ITO electrode and because the lower operating field strengths simultaneously reduce thermal and field-induced quenching mechanisms.

It is possible to generate all other colors from blue light, since blue has the highest energy of all spectral colors. When a dye emitting in the green is illuminated with blue light, then the green dye is excited by the blue light and subsequently emits green light. The is consequently converted from a color having a higher energy into a color having a lower energy—this process is the basic principle of photoluminescence.

This effect can also be used to convert light from a blue emitting organic light emitting diode into other colors. All visible colors, including white and infrared, can be generated by covering the blue diode with one or more different dye layer(s).

By covering a blue LPPP light-emitting diode according to the invention with a layer of a Coumarin 102 dye in a polymethacrylate (PMMA) matrix, the blue light of the LPPP diode is converted in green light emission, thereby generating green light which to the human eye appears three times as bright as the exciting blue light since the human eye is much more sensitive in the green spectral region. The quantum conversion yield from blue into green is here approximately 40%. If the dye layer is applied directly onto the electroluminescence layer without an intervening layer of air, then the quantum conversion yield can be increased to 90% since waveguiding effects between the are minimized. It is more difficult to generate red emission colors by using blue light, since most color dyes emitting in the red have only a small absorption in the blue and can, as a result, not be excited efficiently with blue light. For this reason, a red color dye may be coupled with a green dye for achieving the color conversion blue→green→red.

The other primary colors besides blue, namely red and green, which are necessary for the realization of flat display screens, may be generated, for example, as follows:

Bright green emission (CIE coordinates x=0.27, y=0.62) can be achieved by employing a dye layer Coumarin 102 having a photoluminescence efficiency of 93% in polymethacrylate (PMMA) with an optical density greater than 3. The exciting blue light is completely absorbed in the dye matrix as a result of the strong blue absorption of Coumarin. The resulting bright green emission from the stacked dual-layer structure made of color conversion layers 7 shown in FIG. 2 is composed of the photoluminescence light from the Coumarin dye (90%) and of the green portion of the PHP electroluminescence emission. The main intensity loss occurring during the conversion from blue into green is the result of "waveguiding" and the subsequent quenching of the emission light within the dye layer. In theory, the conversion efficiency can reach 100%.

It is more difficult to efficiently generate red since the spectral overlap of the absorption of the red dyes with the blue emission is generally very small. For this reason, a red dye layer 7 made of Lumogen F300 (photoluminescence efficiency 96%) is coupled with a green Coumarin dye layer 7 (FIG. 2). The red dye has a strong absorption in the green spectral range and thus converts the green excitation into a red photoluminescence emission.

The exciting blue wavelengths are blocked by employing the dielectric bandpass filter having the mirror/transmitter layer 10, whereby spectrally pure red light (CIE: x=0.65, y=0.34) is obtained.

The conversion efficiency from blue into the red emission is approximately 10% when PHP electroluminescence devices are used as illumination source. The observed intensity loss can be primarily attributed to "waveguiding" within the red dye layer, but also to reflection losses of the red light in the interference filter.

An absorption filter could also be used for spectrally filtering the light which absorbs all colors except for the desired emission wavelengths. This method has the disadvantage that the light energy outside the desired emission wavelength region is converted inside the absorption filter into heat. The method applied to the color display screen of the invention for subsequently filtering the emission colors is therefore based on the non-absorbing bandpass of a mirror/transmitter layer. The dielectric mirror/ transmitter layers 10 (FIG. 2) consists of a plurality of layers of materials with alternating high and low index of refraction, e.g. TiO$_2$ with an index of refraction n=2.1 and MgF$_2$ n=1.3. The mirror/transmitter has a high transmission in the desired emission range (T>80%) and a high reflectivity in the remaining spectral range (R>85%). As a result, light can only pass the filter in the spectral range where the mirror/transmitter is highly transparent, whereas the remaining light is reflected back. The portion of the reflected light having a high energy is consequently reflected back and forth between the spectrally selective mirror/transmitter layer 10 and the base electrode layer 2 until it is absorbed and converted by the color dye layers. Spectral filtering can thus be accomplished with a minimum loss of energy with the help of the spectrally selective mirror/transmitter.

As described above, organic color dyes with a high photoluminescence quantum yield (PLQA) are used as color converters in the color conversion layers 7. For the fabrication of homogeneous layers, the color dyes are embedded in polymer matrices, such as PMMA, polystyrene . . . . The color converting layers 7 must have a high optical density so that the exciting light is completely absorbed in the layer. The optical density of the color converting layer 7 increases with the color dye concentration in the polymer matrix. With increasing color dye concentration in the polymer matrix, however, the probability for the color dyes to form aggregates also increases, resulting in a dramatic decrease of the PLQA of the dyes. This concentration effect can be prevented while still achieving the required optical density if the thickness of the color converting layers is increased accordingly. However, thick color conversion layers may adversely affect the resolution which has to be taken into account in the design of the display screen. It may also be possible to minimize the formation of aggregates without increasing the thickness of the color converting layers. This can be accomplished, for example, by binding the dye molecules to the polymers in the form of side chains. These side chain polymers make it possible to obtain very thin layers with a high optical density and a high PLQA. The formation of aggregates can also be minimized by arranging the color dyes in a special crystalline (e.g. lyotropic) matrix wherein the color dye molecules are isolated from each other. In matrices where the color dye molecules are arranged in perpendicular cylindrical structures embedded in the matrix, the emission is more directional than in an isotropic polymer matrix, and such matrices therefore enhance the resolution.

The color conversion method described above can also be used for the generation of polarized multi-color light. In this case, the color conversion layers must contain dyes with a preferential orientation which can be oriented in a liquid crystal matrix. The light emitted from these color conversion layers 7 is then polarized, regardless if the pump source is polarized or not.

It is more difficult to generate polarized white light because the white emission extends across the entire spectral range. White light can be generated by employing the following methods:

(i) The organic light-emitting diode emitting blue polarized light is covered with one or more oriented color conversion layer(s) consisting of anisotropic dyes. The optical density of the oriented color conversion layers is selected such that a portion of the blue excitation light can pass through the color conversion layers and then combines with the portions converted in the color conversion layers to generate white light.

(ii) The organic light-emitting diode emitting blue unpolarized light is covered with one or more oriented color conversion layer(s). The dyes of the color conversion layers are structured such that the dyes absorb in the blue perpendicular to the molecular axis, but emit by an intramolecular energy transfer along the preferential direction of the molecular axis (e.g. Lumogen, registered trademark of the company BASF). By covering the blue light-emitting diode with one or more of those oriented color conversion layer(s), the dyes therein absorb preferentially blue light oriented perpendicular to the molecular axis and thereby also oriented perpendicular to the preferential direction, and emit light in the direction of the molecular axis. Since the blue light in the oriented color conversion layers is absorbed preferentially perpendicular to the molecular axis, the transmitted blue light is also polarized in the direction of the preferential direction of the color conversion layer. The transmitted blue light and the green and red light emitted from the color conversion layer(s) consequently have the same polarization direction, so that polarized white light can be generated by selecting an appropriate dye concentration.

The requirements for the optically at least translucent, conductive electrode 2, such as an almost 100% optical transparency, a good conductivity, a suitable work function and robustness against thermal and mechanical stress are met by indium oxide $In_2O_3$ as preferred material.

Figure 11:
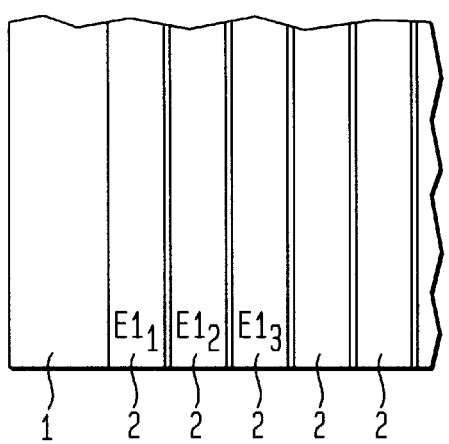
FIGS. 11 to 15 a schematic representation of the method steps for fabricating another embodiment of a color display screen according to the invention.
Figure 12:
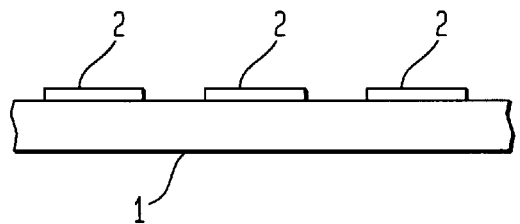

Referring to FIG. 11, the electrode is evaporated on the base layer 1 either as a continuous layer or patterned as a mask, with a layer thickness of up to 500 nm. A photolithographic process may be used for patterning, with the details of the exposure depending on the specific process used therefor.

Examples for such process are:

exposing the stripes with a He—Cd laser generating a holographic grating stripe mask on a transparent medium.

Subsequent to the required etching steps and the removal of the remaining photoresist varnish used for blocking the light, a patterned electrode layer 2 is established on the base layer 1.

In order to obtain the desired properties, the active medium of the electroluminescence layer 3 may consist of a single material or of a combination of different materials.

Figure 13:
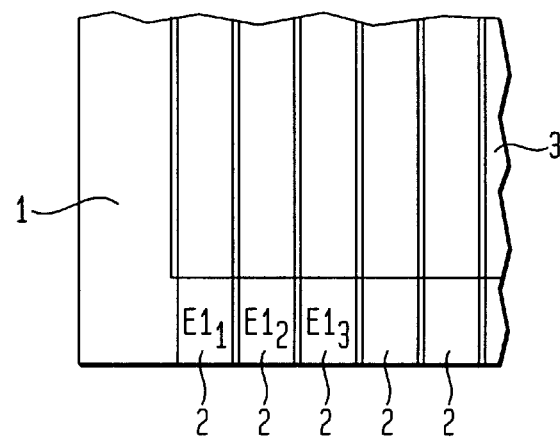
Figure 14:
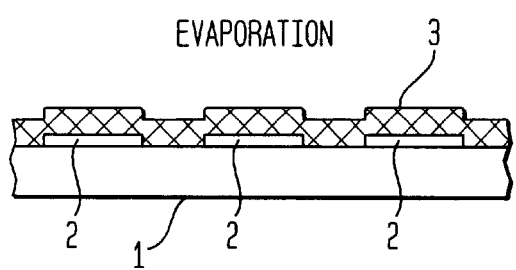
Figure 15:
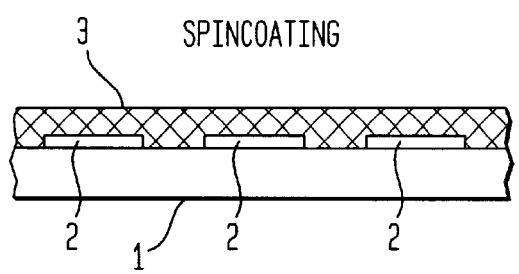

Depending on the active material used, the material can be applied either by evaporation, spreading, or by spin coating, wherein the thickness of the entire active packet can reach 1 mm. It has to be ensured during application that the ends of the control rows 6 and the control columns 2 are kept clear by simply covering the respective surfaces, as shown in FIG. 13, since these surfaces are intended for contacting. With the employed thicknesses of the active medium, it is not difficult to apply the active medium onto the uneven surface of the patterned electrode 2 (FIG. 14). During spin coating of the active layer 3, the unevenness of the electrode 2 is smoothed and a leveled upper surface of the active layer is obtained (FIG. 15).

The materials used must not only have a good conductivity, but also a suitable work function and a high reflectivity. Here, too, different materials and combinations of materials can be employed, with layer thicknesses reaching 1 $\mu$m.

Figure 16:
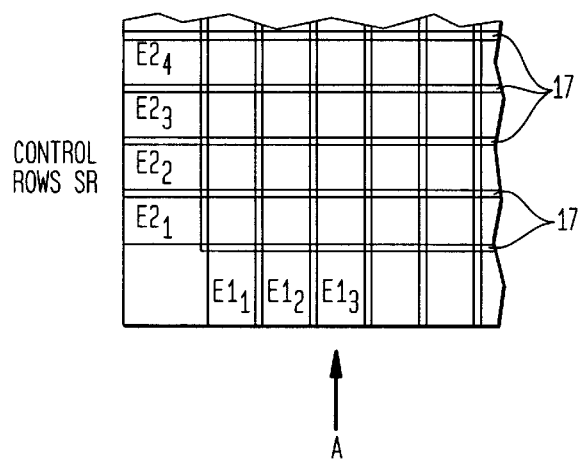
FIGS. 16 to 18 a schematic representation of the method steps for fabricating another embodiment of a color display screen according to the invention.
Figure 17:
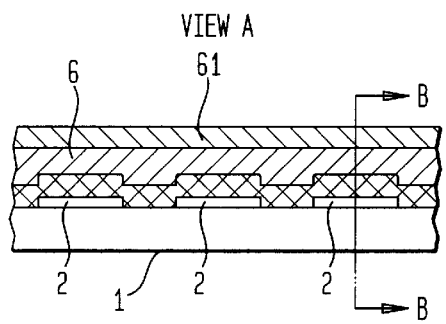
Figure 18:
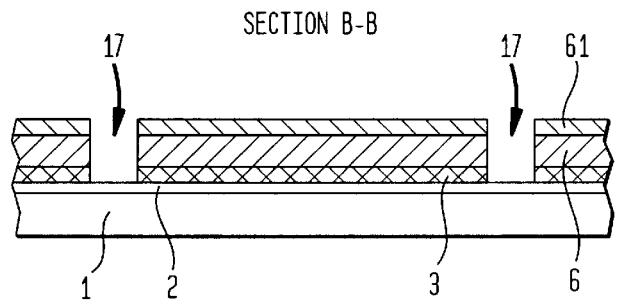
Figure 23:
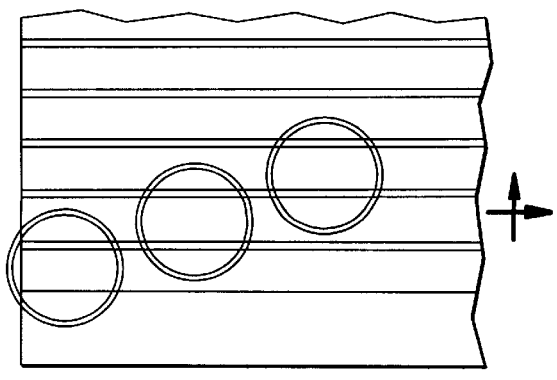
FIGS. 23 and 24 a schematic representation of the method steps for fabricating an embodiment of a color display screen according to the invention.
Figure 24:
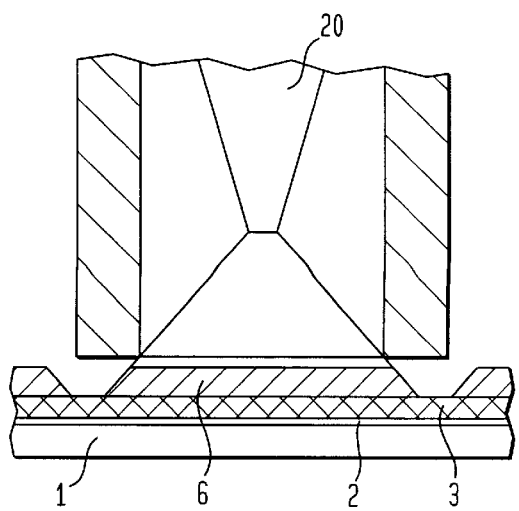

In principle, different techniques can be used for patterning the multi-layer system of the invention (FIGS. 16 to 18). In the embodiment of FIGS. 19 to 22, continuous layers are applied first, followed by patterning. Sputtering, e.g. by an electron beam or ion beam, laser ablation or lithographic methods can be used to accurately remove the intermediate spaces in the cover electrode 6.

Figure 19:
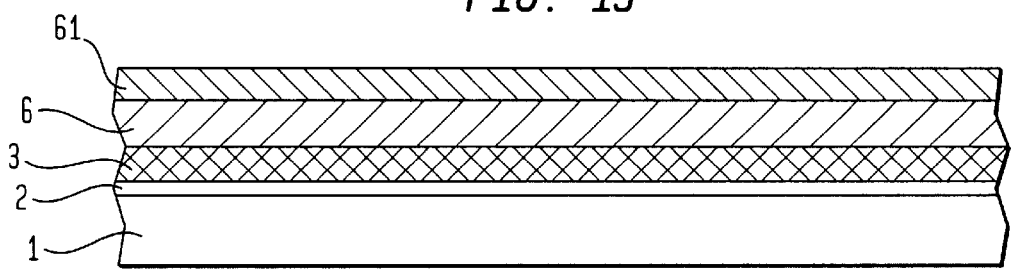
FIGS. 19 to 22 a schematic representation of the method steps for fabricating another embodiment of a color display screen according to the invention.
Figure 20:
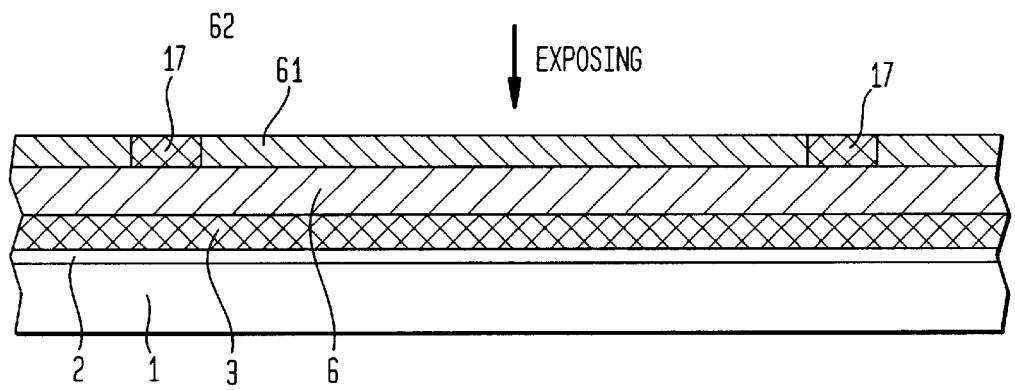
Figure 21:
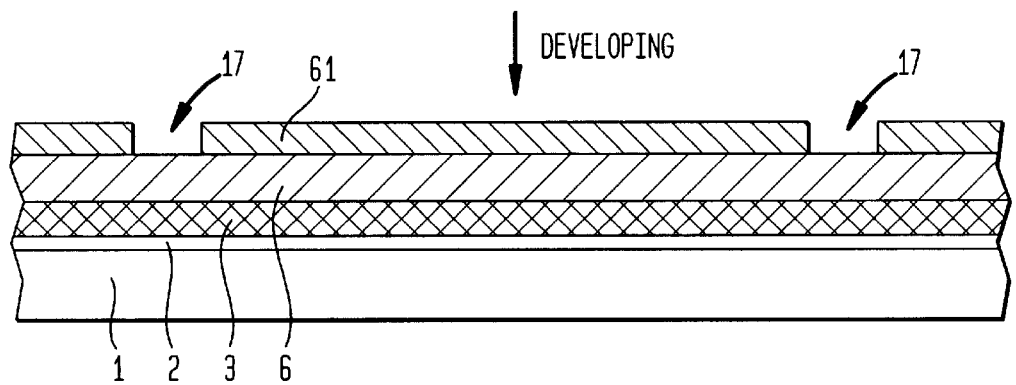
Figure 22:
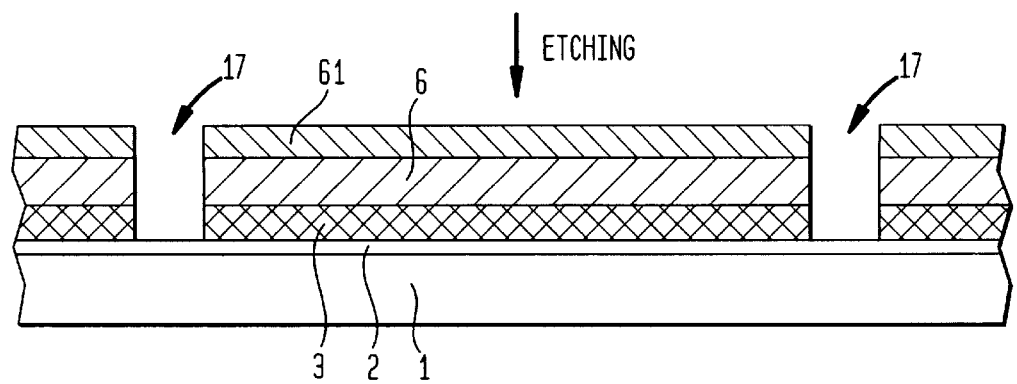

The lithographic methods have the disadvantage that the solvent can attack the active layer. The relatively simple photolithographic process can be successfully employed in the manner illustrated in FIGS. 19 to 22. The cover electrode 6 is covered continuously with a photoresist varnish layer 61 as shown in FIG. 19 and exposed in the areas 17 which correspond to the separation between the control lines 6, through a suitable mask (FIG. 20). The exposed areas (FIG. 21) of the cover electrode 6 and the respective electroluminescence material 3 disposed underneath are etched off (FIG. 22). This results in a distinct separation between the pixels of a control column 2 which is resistant against the employed solvent. The unexposed photoresist varnish 61 may remain on the cover electrode 6 and has to be removed only at the edges where contacts to the cover electrode stripes 6 are to be applied. Since there is no active medium located in these areas, the active material 3 will consequently not be adversely affected by the solvent used for etching.

The cover electrode 6 may also be patterned by selectively evaporating cover electrodes 6 by way of jets 20, as shown in FIGS. 19 and 20, which are applied onto the previously applied electroluminescence layer 3.

Other methods may also be used for fabricating the display screen of the invention.

For the color conversion layers 7, materials can be used which absorb in a specific wavelength range, emit in a suitable wavelength range and achieve a high quantum efficiency, e.g. >90% in dilute solutions, wherein single layers and/or sandwich structures may be employed.

The layers for generating the primary colors are applied by the following methods described hereafter.

The color conversion layers 7 which absorbs in the blue spectral region and emits in the green spectral region, is either applied as a continuous layer on the side of the base layer 1 facing away from the electrode side and subsequently patterned such that only the pixels intended for emission in the blue remain uncovered, while the other pixel areas have respective color conversion layers applied to them (FIG. 2). Subsequently, a highly transparent protective layer 9 is applied onto the so structured area, followed by patterning of a fluorescent color conversion layer 7 absorbing in the green and emitting in the red for fabricating the red pixels. Application of the passivating layer 8 provides a smooth surface and thermal isolation of the fluorescence layers 7. Subsequently, spectrally selective mirror/ transmitter layers 10 adapted to the three primary colors are patterned on top of each light-emitting pixel for spectrally filtering the emitted light.

Figure 25:
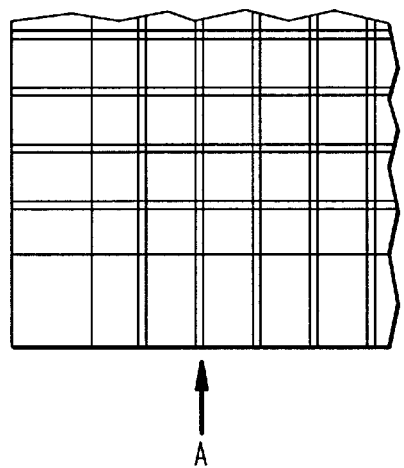
FIGS. 25 to 27 a schematic representation of the method steps for fabricating another embodiment of a color display screen according to the invention.
Figure 26:
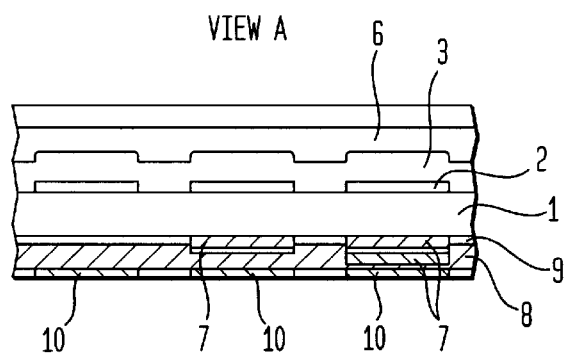
Figure 27:
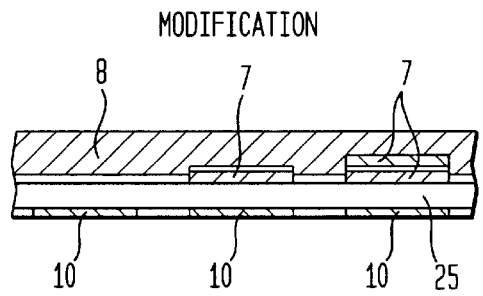

According to a further modification of the invention, shown in FIG. 27, the spectrally selective mirror/transmitter layer 10 may also be patterned on the top surface of a highly transparent foil 25. In this case, instead of the arrangement shown in FIGS. 25 and 26, there is applied a layer system consisting of different color conversion layers 7 and the highly transparent protective layer 25.

Combinations of the aforedescribed modifications may also be selected. The spectrally selective mirror/ transmitter layer 10 is patterned on the top surface of a highly transparent foil 25. The fluorescence layer 7 absorbing in the green and emitting in the red is applied to one side. It is also possible to fabricate on the electrode side of the base layer 1 the fluorescence layer 7 absorbing in the blue and emitting in the green, while the highly transparent protective layer 25 may be optionally disposed therebetween.

There exist further embodiments of an color display screen according to the invention which will be briefly described hereinafter.

For improving the resolution, the separation between the active medium 3 and the fluorescence layers 7 has to be as small as possible. The base layer 1 is consequently constructed as a very thin substrate or—similar to a multi-channel plate—constructed from individual optical fibers for achieving a directional emission.

Figure 28:
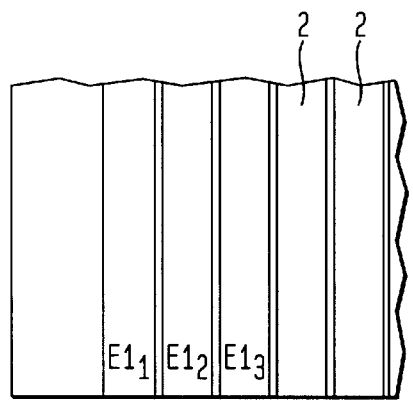
FIGS. 28 and 29, 30 a schematic representation of the method steps for fabricating another embodiment of a color display screen according to the invention.
Figure 29:
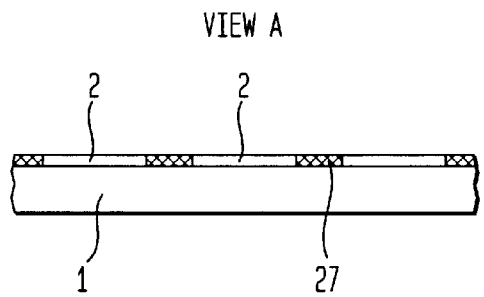

For homogeneously evaporating the active electroluminescence layer 3 onto a level surface, photoresist varnish 27 may be disposed between each of the transparent electrodes 2 for smoothing the height difference between the electrodes (FIGS. 28 and 29).

Figure 30:
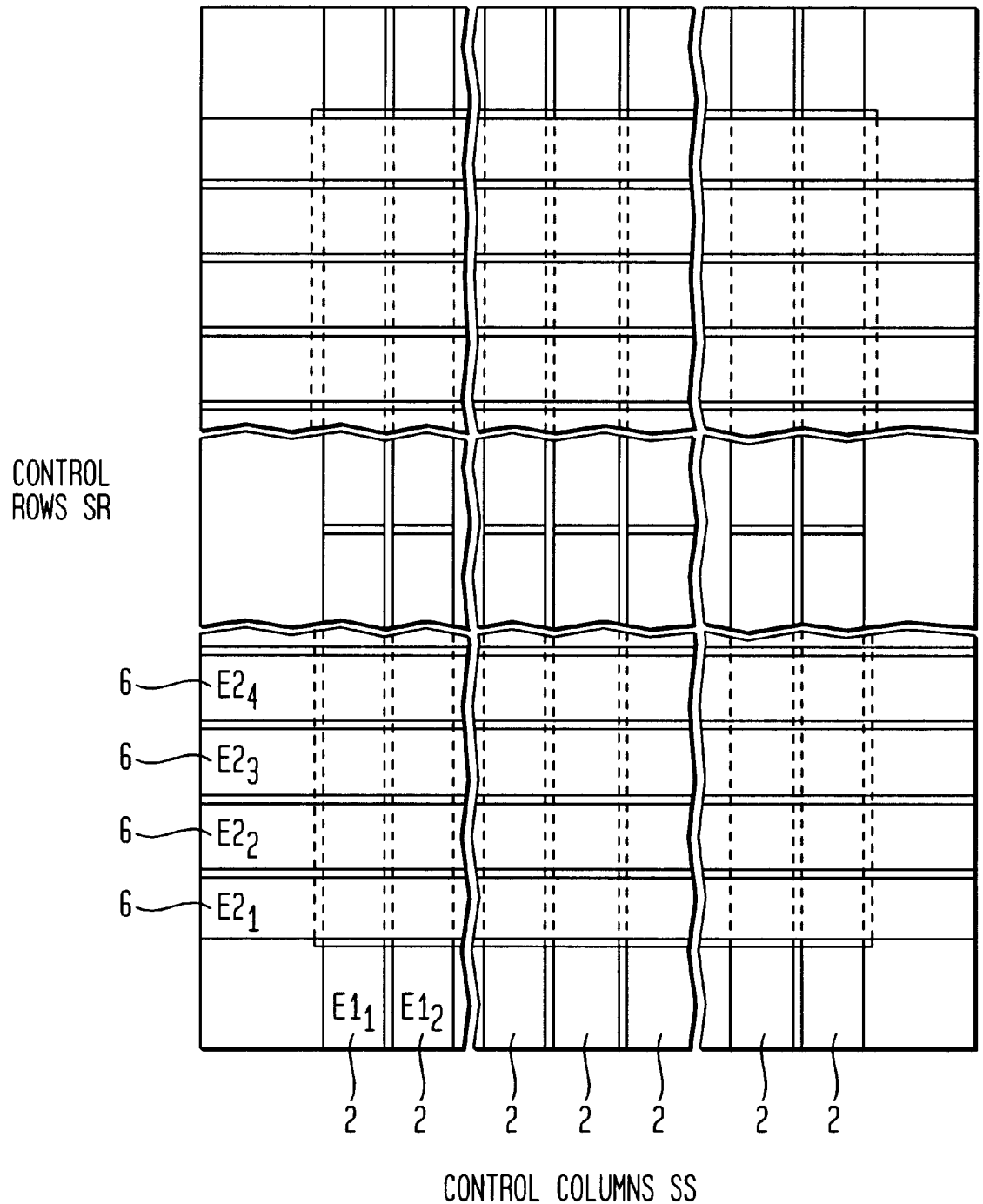

The pixels can be addressed with greater flexibility if the electrodes 2 and 6 are segmented. However, the complexity associated with contacting and addressing will increase accordingly (FIG. 30).

Figure 31:
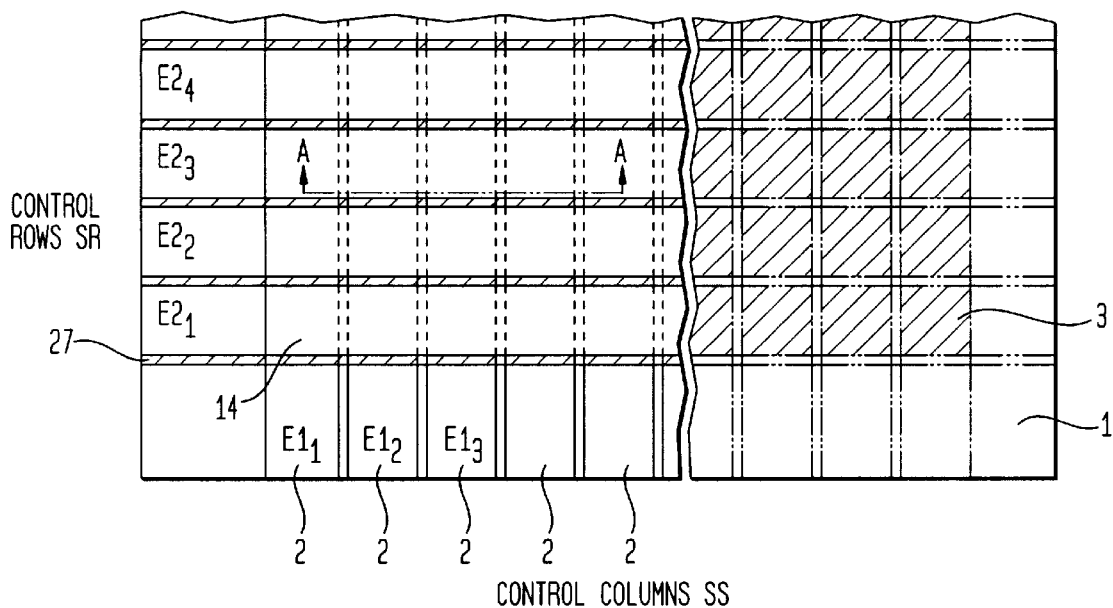
FIGS. 31 to 33 a schematic representation of the method steps for fabricating another embodiment of a color display screen according to the invention.
Figure 32:
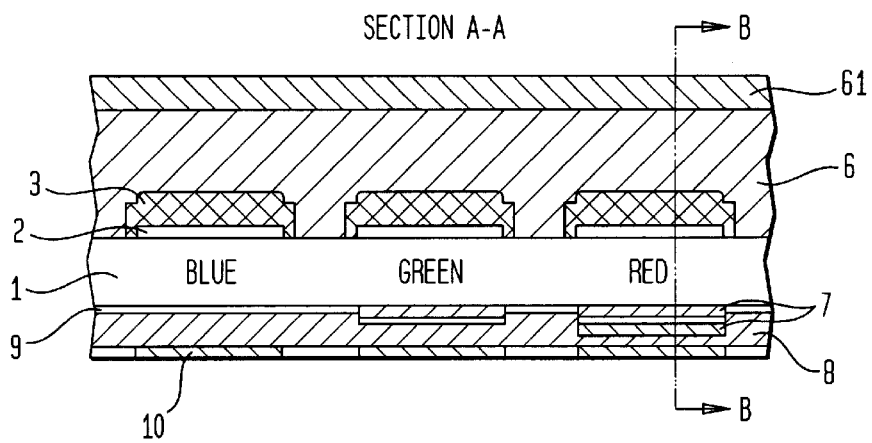
Figure 33:
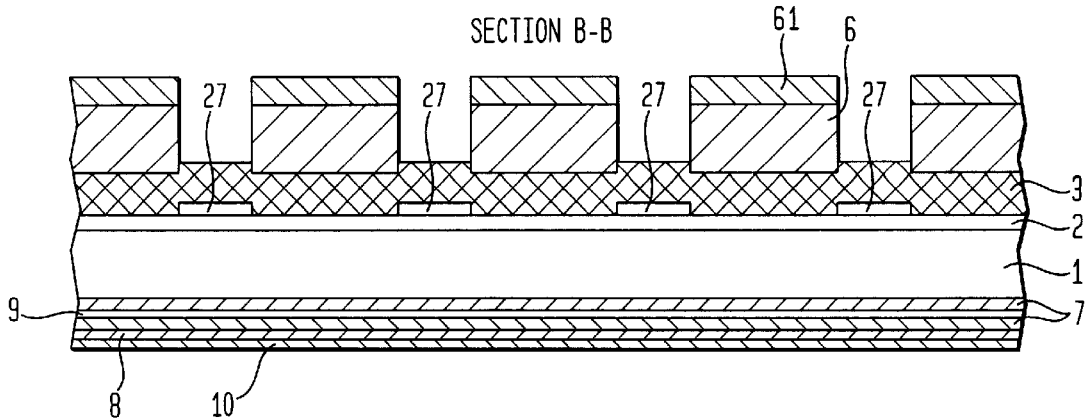

The base electrode 2 is formed as parallel stripes according to the embodiment of FIGS. 31, 32 and 33, on top there is applied an electrically insulating material 27 in form of parallel stripes perpendicular to the parallel stripes 2 of the base electrode. On top of the parallel stripes 2 of the base electrode and in registration therewith, the active electroluminescence material is applied in parallel overlapping stripes 3. The cover electrode layer 6 is then placed in form of parallel stripes perpendicular to the stripes 3 of the active medium and displaced in height with respect to the spaces between the stripes of the insulating material 27.

Figure 34:
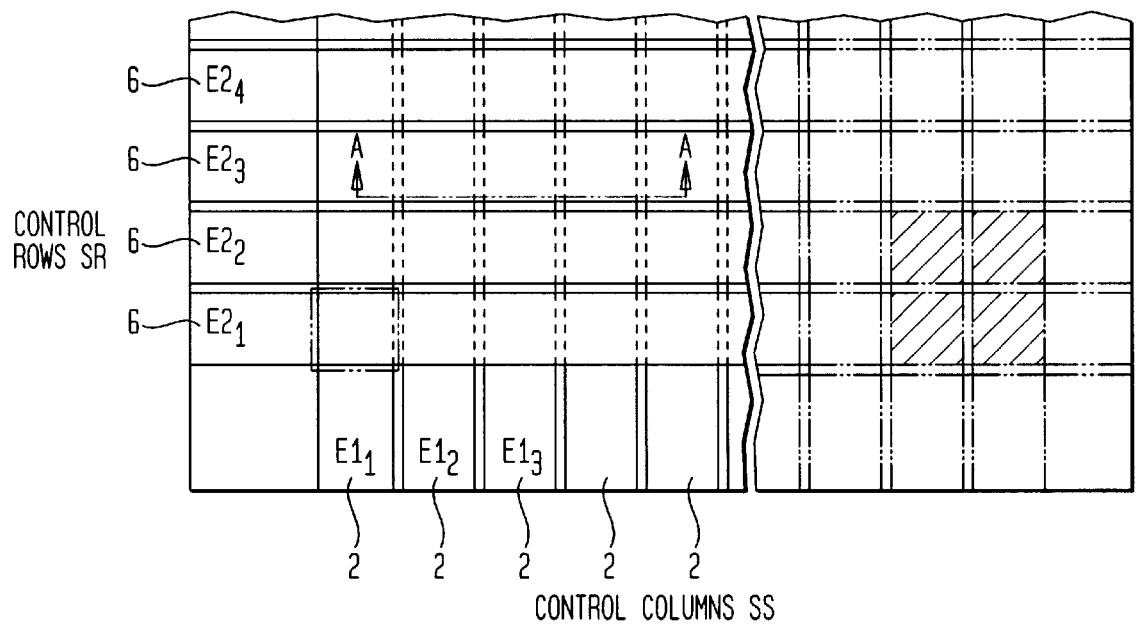
FIGS. 34 to 36 a schematic representation of the method steps for fabricating another embodiment of a color display screen according to the invention.
Figure 35:
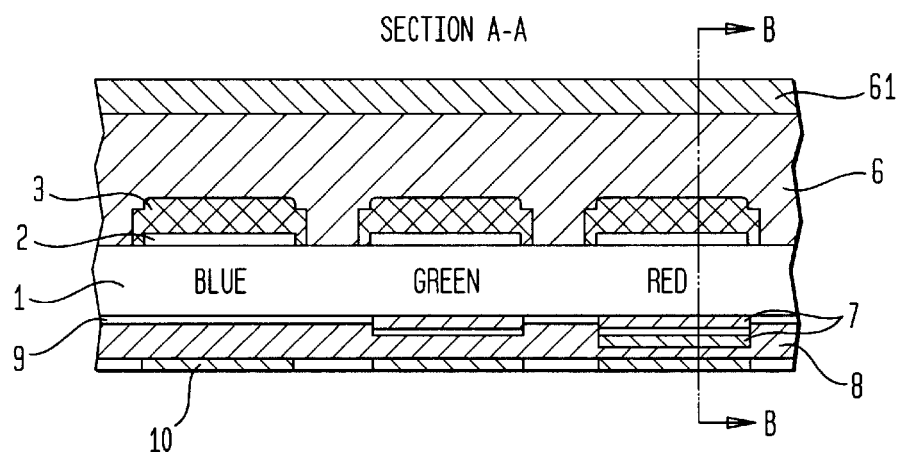
Figure 36:
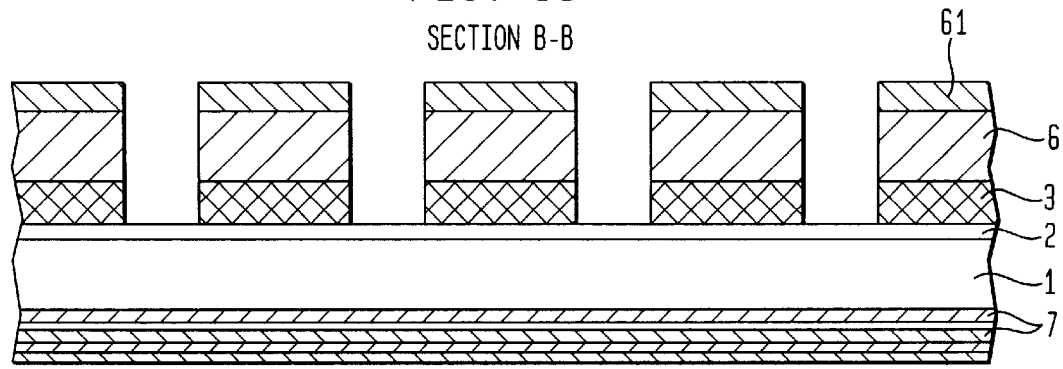

Another embodiment for fabricating a color display screen of the invention is illustrated in the FIGS. 34, 35 and 36. The base electrode 2, the hole injection layer 12 (not shown) and the active electroluminescence layer 3 are applied onto the base layer 1 as a sandwich structure in form of parallel stripes. The electron injection layer 13 (not shown) and the cover electrode 6 are subsequently evaporated over the entire area and then patterned by lithographic means in form of parallel stripes perpendicular to the stripes of the base electrode 1, whereby the active medium 3 is patterned at the same time forming the actual pixels.

Figure 37:
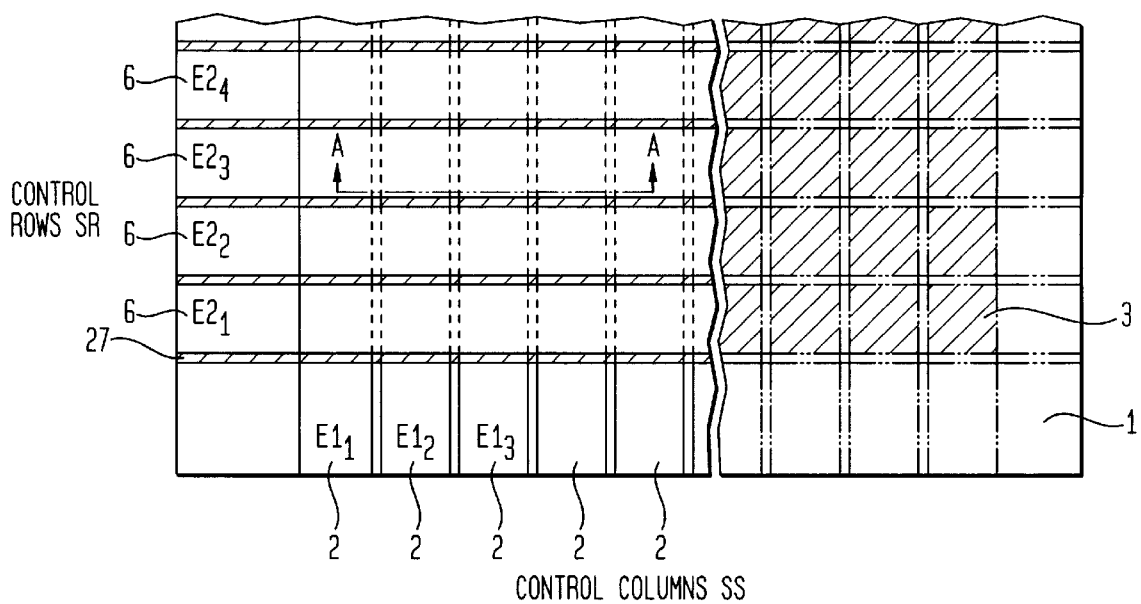
FIGS. 37 to 39 a schematic representation of the method steps for fabricating another embodiment of a color display screen according to the invention.
Figure 38:
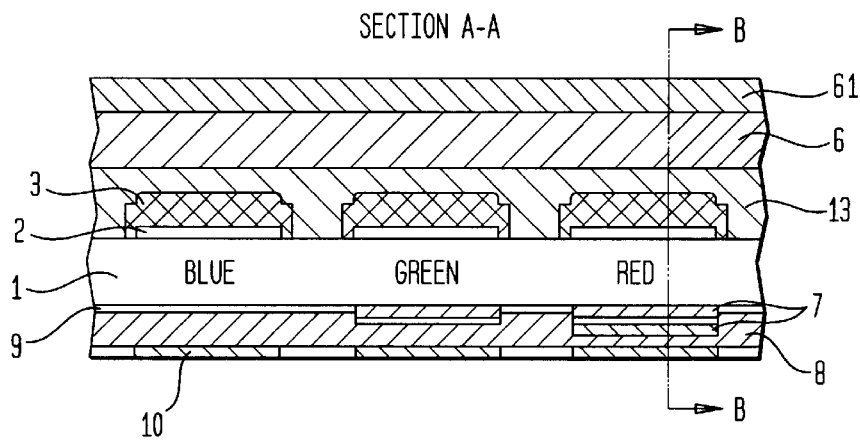
Figure 39:
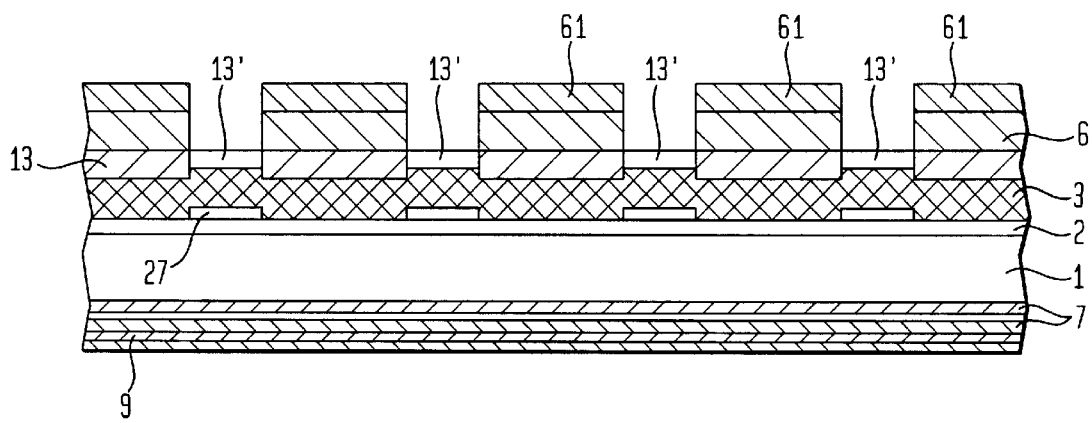

In another embodiment shown in FIGS. 37 to 39, the base electrode 2 is formed as parallel stripes, and a layer of insulating material 27 is applied on top thereof in form of parallel stripes perpendicular to the stripes of the base electrode 2. The active medium of the electroluminescence layer 3 is formed on top of the stripes of the base electrode 2 and parallel therewith. A suitable electron injection layer 13 is applied as a continuous area and exposed in form of parallel stripes 13' which thereby become insulating. The cover electrode layer 6 can now be patterned without problems.

What is claimed is:

1. Electroluminescence color display screen having matrix picture elements, the display screen comprising a multi-layer structure disposed on opposite sides of an insulating, optically at least translucent base layer, the layer structure comprising:

a) on a first side of the base layer:

a conductive, optically at least translucent base electrode layer abutting the first side and patterned into a plurality of electrically mutually isolated longitudinal stripes extending in a first direction;

an at least partially light-reflective top electrode layer arranged on the base electrode layer and patterned into a plurality of electrically mutually isolated longitudinal stripes extending in a second direction which is different from the first direction; and a first organic electroluminescence layer disposed between the base electrode layer and the top electrode layer and capable of emitting optical radiation in a wavelength range characterized by a first electroluminescence wavelength; and b) on a second side of the base layer:

a spectrally selective reflector; and at least one color conversion layer arranged between the second side of the base layer and the spectrally selective reflector, wherein the at least one color conversion layer produces a light emission in a wavelength range characterized by at least one other wavelength different from the first electroluminescence wavelength upon excitation by the first electroluminescence wavelength, and wherein the spectrally selective reflector reflects light at the first electroluminescence wavelength and transmits light at the other wavelength for spectrally filtering the transmitted light at the first wavelength and improving the color conversion efficiency of the color display screen at the other wavelength.

2. The electroluminescence color display screen according to claim 1, wherein the spectrally selective reflector comprises a plurality of layers, with the optical index of refraction of consecutive layers alternating between a first value and a second value which is different from the first value.

3. The electroluminescence color display screen of claim 2, wherein the layer with the first value of the optical index of refraction is made of $TiO_2$ and the layer with the second value of the optical index of refraction is made of $MgF_2$.

4. The electroluminescence color screen according to claim 1, and further comprising an optically transparent protection layer disposed between the base layer and the spectrally selective reflector and overlaying said base layer and a first of the at least one color conversion layers.

5. The electroluminescence color display screen of claim 1, including at least two color conversion layers, with a first color conversion layer producing a light emission in a wavelength range characterized by a first wavelength different from the first electroluminescence wavelength upon excitation by the first electroluminescence wavelength and a second color conversion layer producing a light emission in a wavelength range characterized by a second wavelength different from the first wavelength upon excitation by the first wavelength, and wherein the spectrally selective reflector reflects light at the first electroluminescence wavelength and the first wavelength and transmits light at the second wavelength for spectrally filtering the transmitted light at the second wavelength and improving the color conversion efficiency of the color display screen at the second wavelength.

6. The electroluminescence color screen according to claim 5, and further comprising one or more isolation layers disposed between the at least two color conversion layers.

7. The electroluminescence color display screen according to claim 1, wherein the base layer comprises individual light guides arranged in an emission direction of the light.

8. The electroluminescence color display screen according to claim 1, wherein the stripes of the base electrode layer and the stripes of the top electrode layer each have discontinuity transverse to their respective longitudinal directions.

9. The electroluminescence color display screen according to claim 1, wherein the at least one color conversion layer comprises fluorescent dye molecules that are chemically bonded to a backbone molecule to form a side chain.

10. The electroluminescence color display screen according to claim 9, wherein the fluorescent dye molecules are embedded in a matrix material which is embedded in the color conversion layers so as to isolate the fluorescent dye molecules from each other.

11. The electroluminescence color display screen of claim 10, wherein the matrix comprises PMMA or polystyrene.

12. The electroluminescence color display screen according to claim 9, wherein the fluorescent dye molecules in the color conversion layer have a specific orientation.

13. The electroluminescence color display screen according to claim 1, wherein the top electrode layer is made of two or more materials.

14. The electroluminescence color display screen according to claim 1, wherein the light emission at the at least one other wavelength is optically polarized.

15. The electroluminescence color display screen according to claim 1, and further comprising a second electroluminescence layer disposed between the base electrode layer and the top electrode layer and capable of emitting optical radiation in a wavelength range characterized by a second electroluminescence wavelength different from the first electroluminescence wavelength, the first and second electroluminescence wavelength each corresponding to a primary color, wherein the wavelength of the light emission produced by the color conversion layer represents a third primary color which is different from the primary colors corresponding to the first and second electroluminescence wavelength.

* * * * *